(12) United States Patent
Rieger

(10) Patent No.: US 7,307,010 B2
(45) Date of Patent: Dec. 11, 2007

(54) METHOD FOR PROCESSING A THIN SEMICONDUCTOR SUBSTRATE

(75) Inventor: Walter Rieger, Arnoldstein (AT)

(73) Assignee: Infineon Technologies AG, Munich (DE)

(*) Notice: Subject to any disclaimer, the term of this patent is extended or adjusted under 35 U.S.C. 154(b) by 19 days.

(21) Appl. No.: 10/954,763

(22) Filed: Sep. 30, 2004

(65) Prior Publication Data
US 2006/0035441 A1 Feb. 16, 2006

(30) Foreign Application Priority Data
Sep. 30, 2003 (DE) ............... 103 45 494

(51) Int. Cl.
H01L 21/44 (2006.01)

(52) U.S. Cl. ............ 438/597; 438/459; 257/341; 257/343; 257/E21.159

(58) Field of Classification Search ........ 438/459, 438/597; 269/903; 414/935; 257/341, 343, 257/E21.159
See application file for complete search history.

(56) References Cited

U.S. PATENT DOCUMENTS

| | | | |
|---|---|---|---|
| 5,476,810 A | 12/1995 | Curran | |
| 6,047,480 A * | 4/2000 | Powers | 33/645 |
| 6,127,727 A | 10/2000 | Eytcheson | |
| 6,392,290 B1 | 5/2002 | Kasem et al. | |
| 6,599,778 B2 * | 7/2003 | Pogge et al. | 438/118 |
| 2002/0110449 A1 | 8/2002 | Arlt et al. | |
| 2003/0092215 A1 | 5/2003 | Amagai et al. | |
| 2003/0235937 A1 | 12/2003 | Mong et al. | |
| 2004/0009649 A1 * | 1/2004 | Kub et al. | 438/459 |
| 2004/0031987 A1 | 2/2004 | Henninger et al. | |
| 2004/0036140 A1 * | 2/2004 | Okabe et al. | 257/500 |
| 2004/0263108 A1 * | 12/2004 | Lim et al. | 318/640 |
| 2005/0233548 A1 * | 10/2005 | Arai | 438/459 |

FOREIGN PATENT DOCUMENTS

DE 100 20 412 8/2001

* cited by examiner

Primary Examiner—George Fourson
Assistant Examiner—John M. Parker
(74) Attorney, Agent, or Firm—Dicke, Billig & Czaja, PLLC

(57) ABSTRACT

A method for processing a semiconductor substrate less than 200 μm thick has been provided. The substrate has one or a plurality of semiconductor elements, which may be identical or different. The substrate is arranged onto a chuck during processing, the front side of the substrate facing the chuck. During processing, an electrically conductive film, for example, made of metal, may be applied on the rear side of the substrate. The film may serve as electrical contact, heat sink or mechanical stabilizer.

14 Claims, 6 Drawing Sheets

METHOD FOR PROCESSING A THIN SEMICONDUCTOR SUBSTRATE

CROSS-REFERENCE TO RELATED APPLICATIONS

This Utility Patent Application claims priority to German Patent Application No. DE 103 45 494.2, filed on Sep. 30, 2003, which is incorporated herein by reference.

BACKGROUND

The thickness of the semiconductor element and semiconductor wafer in which the element is incorporated plays a crucial part for applications such as smart cards, insulated gate bipolar transistors (IGBTs), high-power transistors and also diodes. In the case of the new generation of discrete power semiconductor components, it is thus possible to reduce the on resistivity and to minimize the forward voltage in the case of the diodes. Reducing the substrate thickness is advantageous in both of these cases. The invention relates to the processing of specially thin semiconductor substrates that contain the semiconductor elements.

The conventional steps developed in semiconductor technology are used in order to thin a wafer. The thick silicon wafers are generally ground thin only at the end of the process and processed differently to a conclusion. In this case, the processing may comprise steps such as ion doping, furnace processes, metallization or further steps. However, the processing of such thin substrates is a very great challenge since the silicon chips are very sensitive and can be damaged very easily. The minimum thickness of a wafer is therefore limited by the loss rate during the subsequent handling steps. Therefore, it is necessary to make a compromise in the thickness of the wafer and the yield. In order to minimize the loss rates, in accordance with the prior art, the wafers are additionally reinforced with a bonded-on plastic film in order to increase the mechanical stability. The difficulty in this method is that thin ground wafers are extremely fracture-sensitive, so that the wafer may be damaged when resolving the plastic film. Therefore, use is made of adhesives which lose their adhesive strength almost completely after UV exposure. However, the adhesives are not thermostable, so that wafers can only be processed under more difficult conditions.

The prior art also discloses further methods such as applying the wafer to a holding device, to which the wafer is applied and remains during the thinning of the wafer for some or all further process steps. These holding devices, described in EP 1 217 655, enable the wafer to adhere electrostatically to the holding device, and a certain mechanical stability of the wafer is thereby ensured. It has been shown, however, that the mechanical stability in the case of such a device does not suffice to minimize the loss rate since there is still a certain risk of fracture after the wafer has been stripped away from the holding device. According to the current prior art, the thickness of 75 μm for a 6-inch wafer (150 mm) is the absolute limit for handling and further processing. For an 8-inch wafer (200 mm), the limit is 175 μm.

SUMMARY

The present invention provides a method for processing very thin semiconductor substrates which can be subjected to handling, in the case of which the loss rate is lower than in the conventional methods.

One method according to the invention also enables processing of the wafers with a thickness that is smaller than that of the current prior art.

In one embodiment, a method is provided for processing a semiconductor substrate less than 200 μm thick having one or a plurality of semiconductor elements contained therein. The substrate is arranged on a holding device, referred to hereinafter as "chuck", the front side of the semiconductor substrate is facing the chuck and an electrically conductive film, which is in one case no longer removed, is applied to the rear side of the substrate. Since the substrate adheres to the chuck, it is possible to carry out the further process steps on the semiconductor substrate without the risk of corrugation or distortion of the substrate.

In the method according to one embodiment of the invention, an electrically conductive film that serves as an electrical contact, a heat sink and as a mechanical stabilizer is applied to the rear side of the substrate. The carrier film may comprise copper or aluminum, for example, in order to satisfy all these requirements. The film then becomes a constituent of the substrate and need no longer be removed.

In one embodiment of the invention, the chuck is an electrostatic chuck to which the substrate fixedly adheres.

In an alternative embodiment, a magnetic chuck is used.

The semiconductor elements contained in the semiconductor substrate may be identical or different and be high-power transistors, IGBTs and/or diodes.

In one embodiment, the thickness of the electrically conductive film is from 5 to 200 μm. The thickness of the film enables a good mechanical stability and, at the same time, it may serve as an electrical contact.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
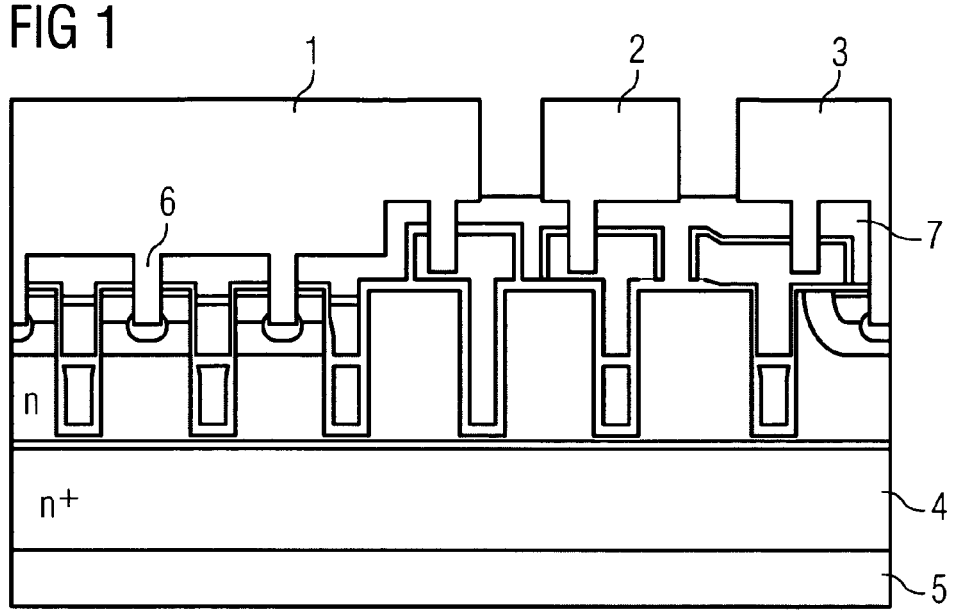
FIG. 1 illustrates a semiconductor substrate with power transistors according to the prior art.

FIG. 1 illustrates a semiconductor substrate with power transistors contained therein according to the current prior art. The power transistors are represented by way of example and may be replaced by arbitrary semiconductor elements. The structures represented in the figures are disclosed e.g. in DE 102 12 148 and DE 102 34 996, which are incorporated by reference herein. The illustrated structure includes a source electrode 1, gate electrode 2, and drain 3. The structure includes a $n^+$-doped substrate 4, and a non-grounded substrate 5. A poly plug 6 is provided adjacent the source electrode 1, and an intermediate oxide 7 is also provided in the structure. The substrate thickness in FIG. 1 is approximately 175 μm, so that the Rdson is 1.5 mohm. The minimum thickness according to the present-day process status is approximately 150 μm.

Figure 2:
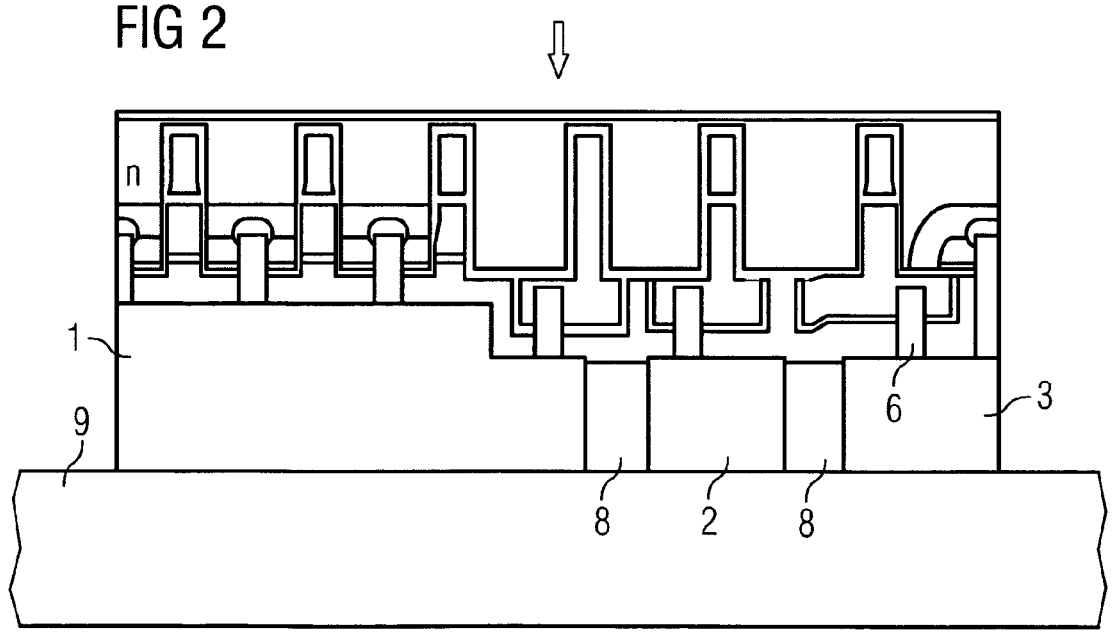
FIG. 2 illustrates a semiconductor substrate applied on a chuck in accordance with the present invention.

FIG. 2 illustrates a wafer having a semiconductor substrate which is applied on a chuck 9 and subsequently processed, so that the thickness of the substrate is reduced to the desired thickness. The wafer is illustrated rotated 180° relative to that illustrated in FIG. 1. In this way, the rear side of the wafer is illustrated on top, designed by the arrow. Since a metal layer is deposited on the front side of the substrate, which is in some cases polarized, it is possible to use an electrostatic chuck.

Figure 3:
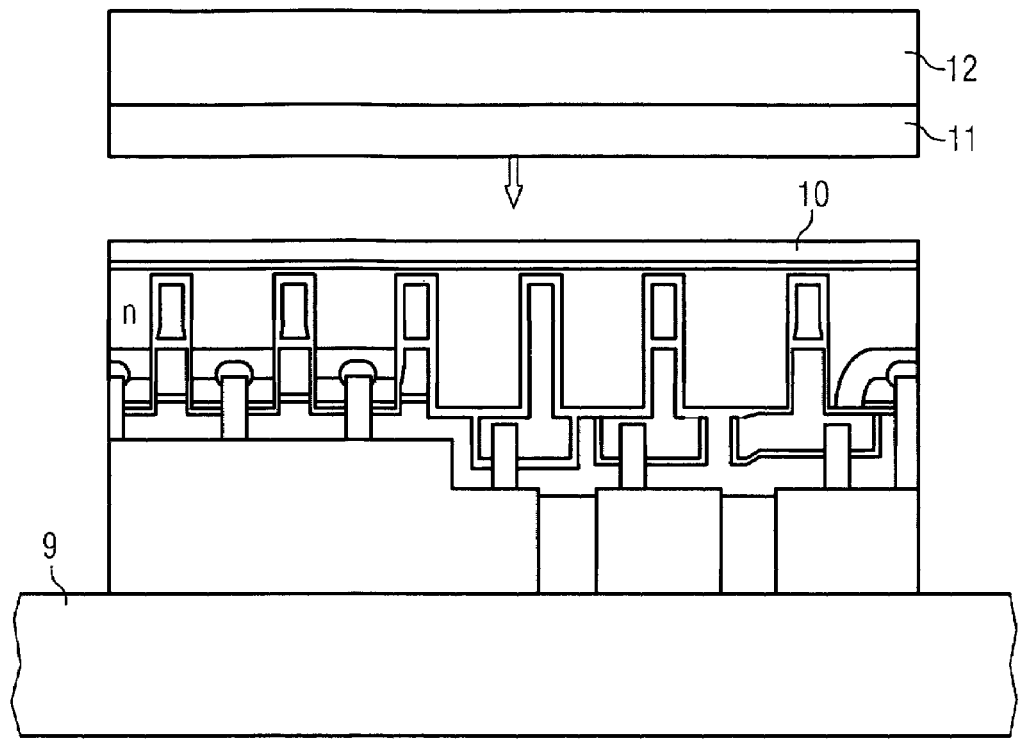
FIG. 3 illustrates the application of a carrier film.

FIG. 3 illustrates the application of a carrier film 12, an adhesion promoting layer 11 being applied to the carrier film 12. In one embodiment, a rear side metallization 10 is added.

Figure 4:
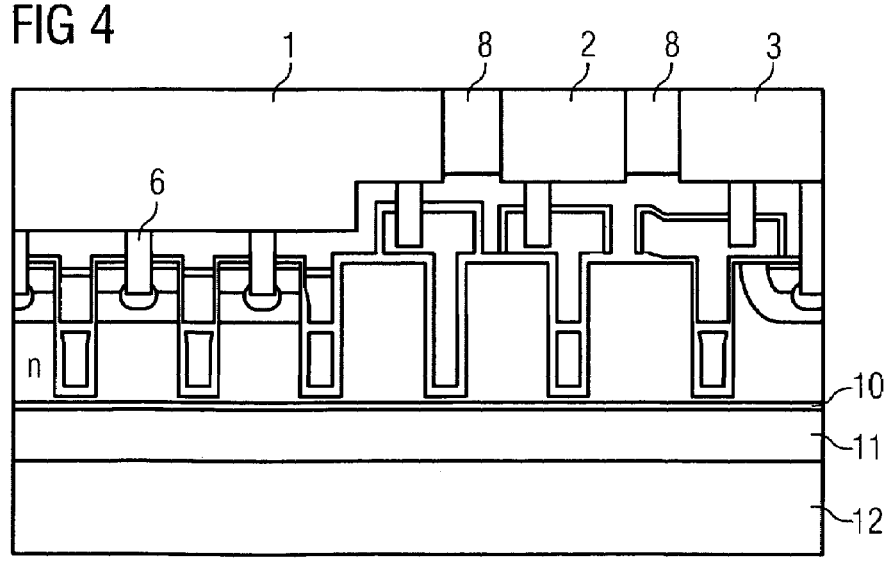
FIG. 4 illustrates a finished processed semiconductor substrate.

FIG. 4 illustrates the finished processed semiconductor substrate with the semiconductor elements contained therein. The structure illustrated in FIG. 4 is rotated 180° relative to that illustrated in FIGS. 2 and 3.

Figure 5:
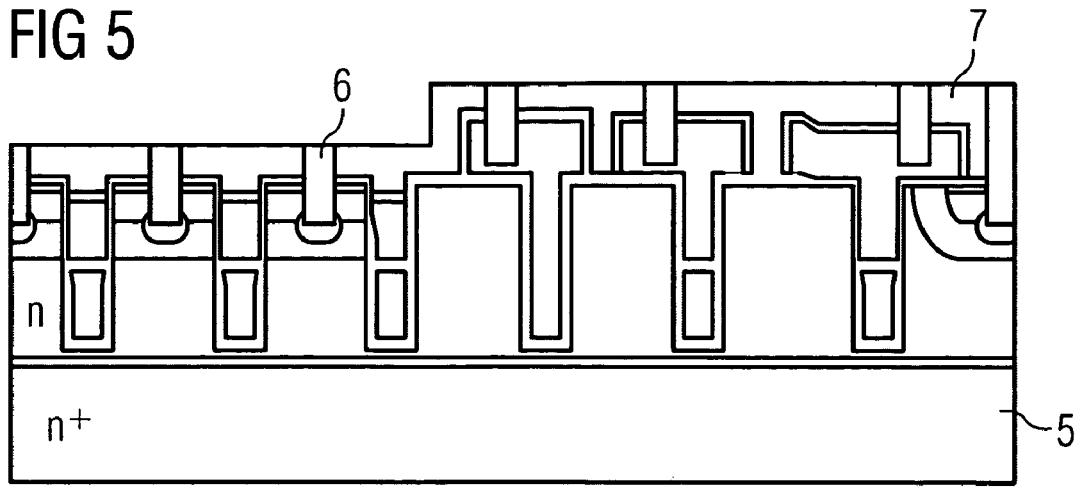
FIGS. 5 and 6 illustrate a semiconductor substrate enabling the electrodes to be patterned.
Figure 6:
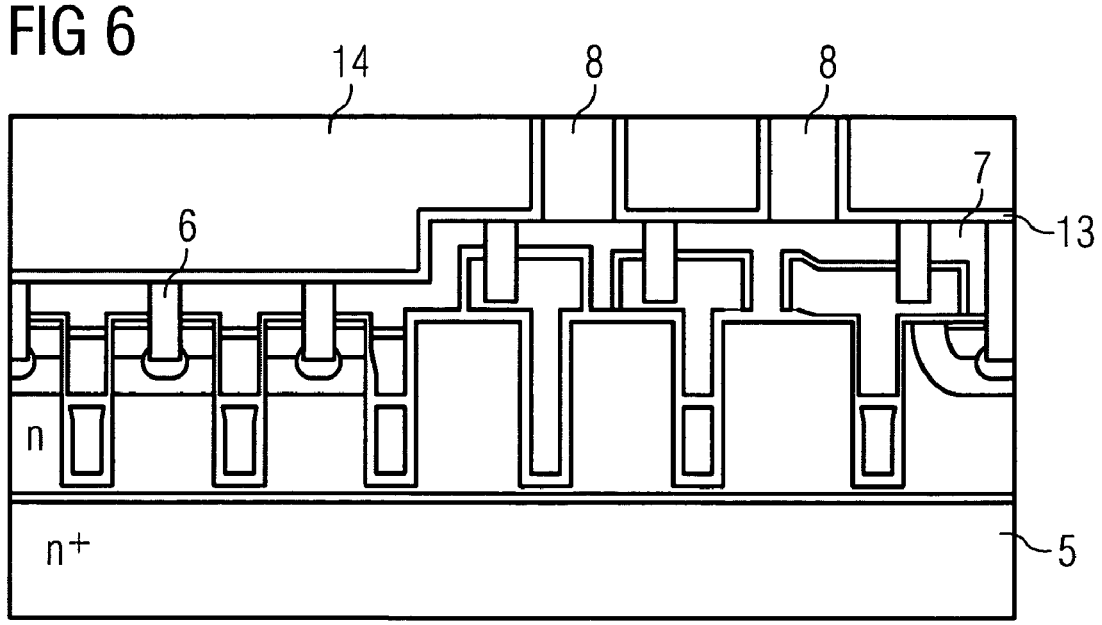

FIG. 5 and FIG. 6 illustrate a possibility enabling the electrodes to be patterned. An insulator, for example CVD oxide or TEOS oxide, is deposited onto the structure illustrated in FIG. 5 and insulator ridges 8 are produced by means of a phototechnology and an anisotropic oxide plasma etching, said ridges 8 later constituting the insulation between the conductive regions. After the deposition of a liner 13, which is also deposited as a metal, typically titanium/titanium nitride and copper or tungsten, deposited by means of plating or CVD, the metal layer 14 is subjected to chemical mechanical planarization (CMP) to polish it back, which stops on the oxide ridges. The further processing may be effected further as in the steps illustrated in FIGS. 2 to 4.

FIGS. 7 to 10 illustrate a further alternative for the patterning of electrodes.

Figure 7:
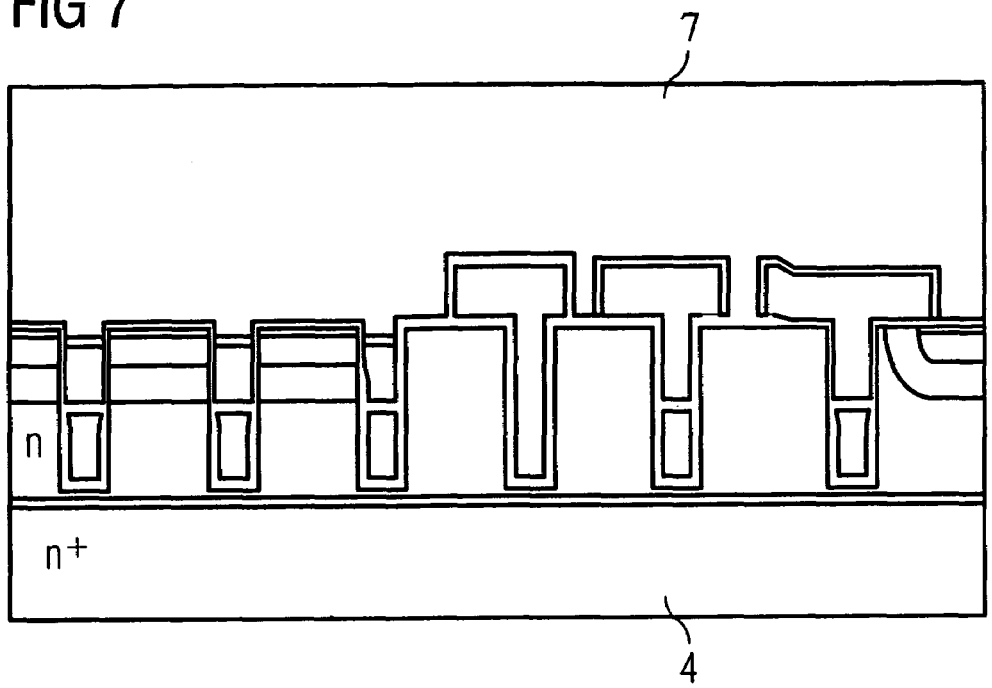
FIGS. 7-10 illustrate further alternatives for patterning electrodes on the substrate.
Figure 8:
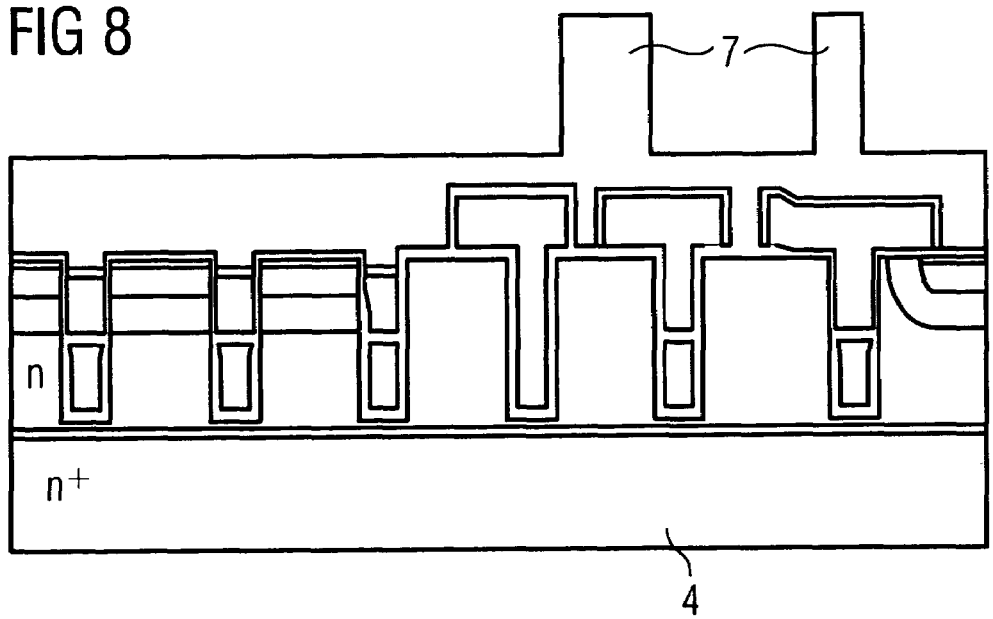
Figure 9:
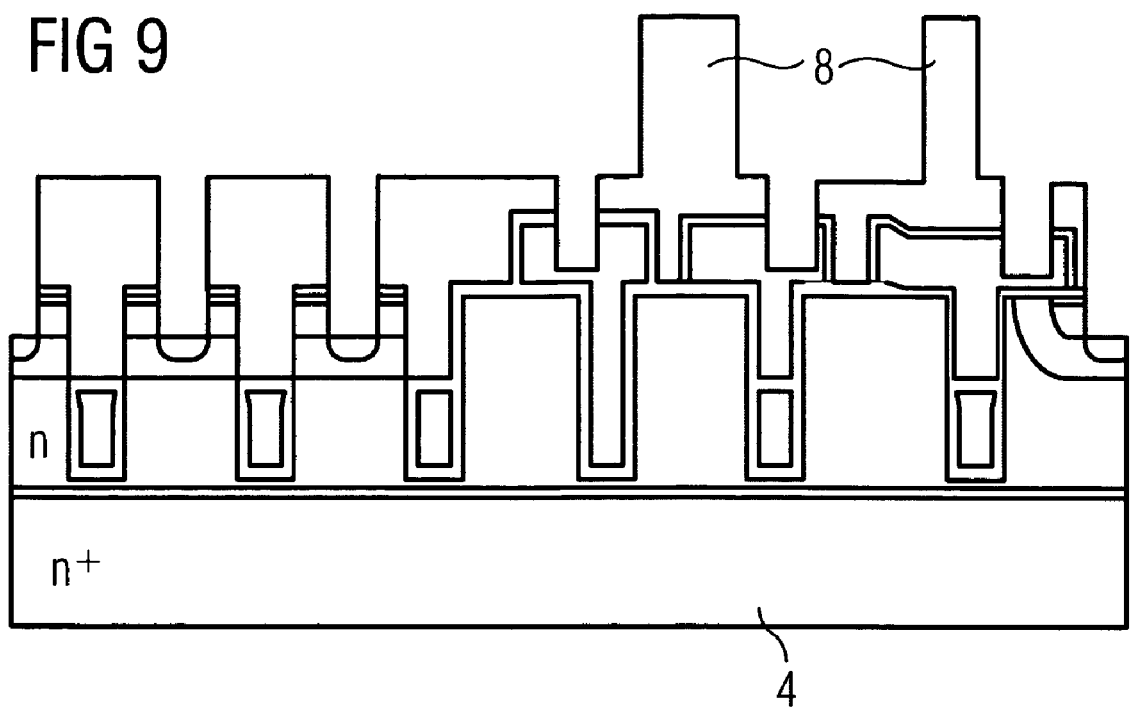
Figure 10:
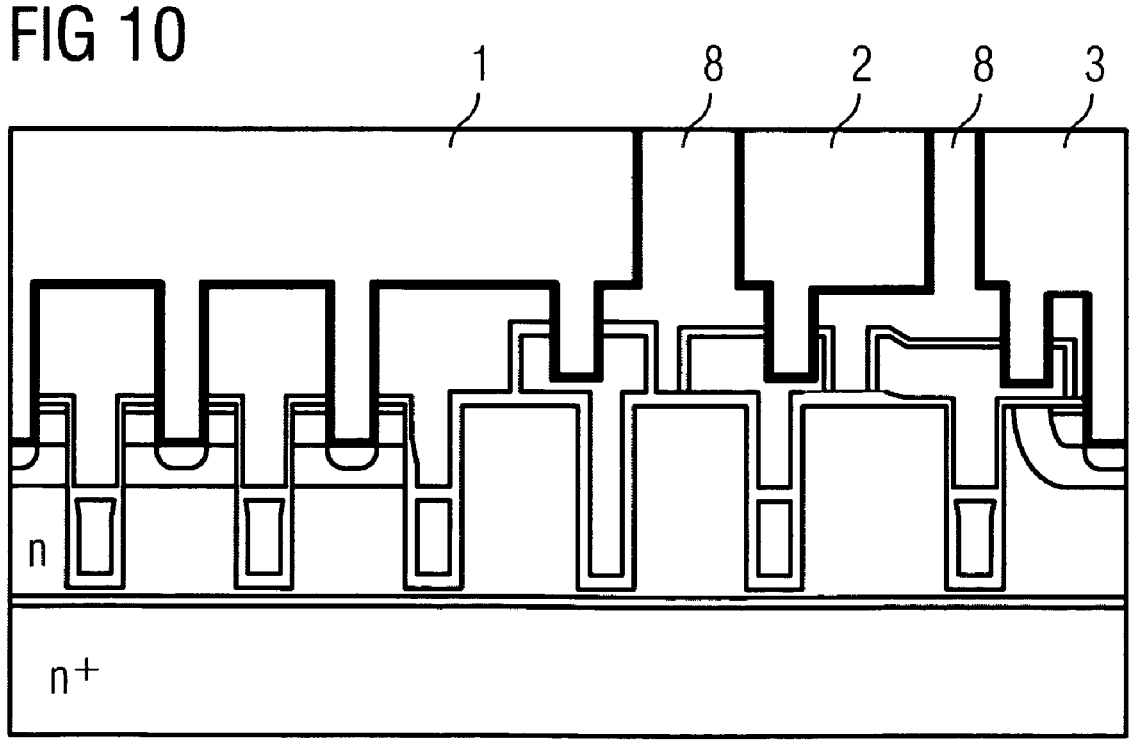

FIG. 7 illustrates a structure produced after the fabrication of the trench transistor according to a known process, after the deposition of a thick insulator 7 (intermediate oxide) and after a CMP planarization. As illustrated in FIG. 8, after the CMP, wells are produced by means of a first phototechnology and an anisotropic oxide plasma etching (fixed time etching), said wells later constituting the conductive regions. After the first patterning, contact holes are produced by means of a second phototechnology and an anisotropic oxide plasma etching taken as far as the silicon surface and trenches are subsequently produced after the resist stripping with the aid of a selective silicon etching. The structure is illustrated in FIG. 9. Afterward, a liner may be deposited. The liner is in one case made of titanium/titanium nitride. After this step, a further layer made of copper or tungsten is deposited, either by plating or CVD, and this metal layer is processed further by means of a metal CMP. The chemical mechanical planarization (CMP) is taken as far as oxide ridges.

Figure 11:
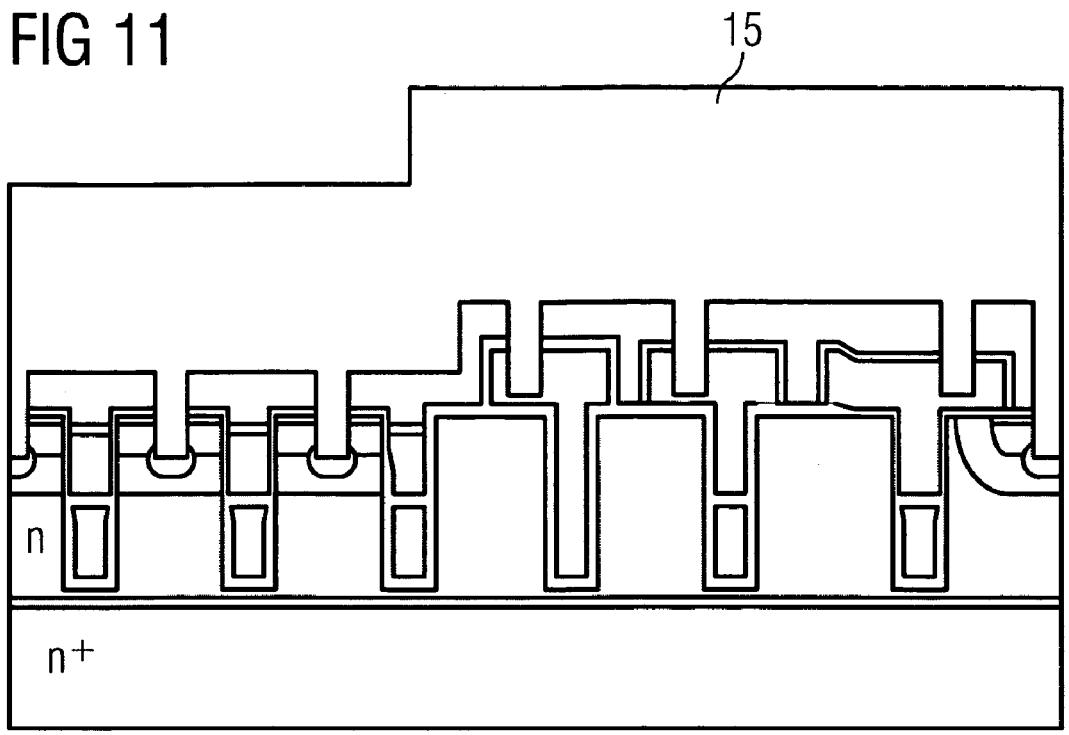
FIGS. 11-12 illustrate further alternatives for patterning electrodes on the substrate.
Figure 12:
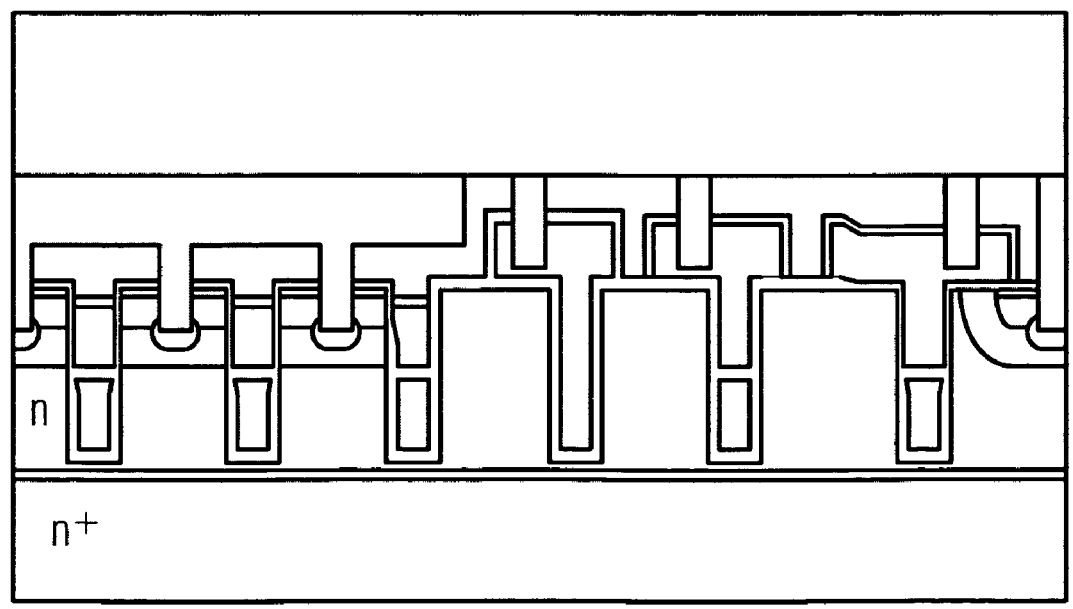

FIGS. 11 to 12 illustrate another possibility for patterning the electrodes.

FIG. 11 represents a structure which is implemented according to the process in accordance with the prior art for fabricating a trench transistor up to the deposition of the poly plug 6. The structure essentially corresponds to the structure illustrated in FIG. 7 with the exception that the polysilicon layer 15 is deposited substantially thicker. An aluminum silicon copper metal layer (AlSiCu) is sputtered onto said polysilicon layer, which is processed by CMP beforehand and etched as far as the intermediate oxide. It is then possible to proceed further with the steps illustrated in FIGS. 2 to 4.

FIGS. 2 to 12 therefore illustrate three variants of possible process sequences for power transistors in which the semiconductor substrates can be thinned to a few μm and processed further without having to effect handling steps with thin wafers. In this case, the carrier film 12, in some cases comprising copper, aluminum or silver, serves as electrical contact, heat sink and mechanical stabilizer. As already described above, said carrier film 12 need not necessarily comprise metal, rather it is also possible to use other materials if the physical requirements made of the electrical conductivity, thermal and mechanical stability are fulfilled. In one embodiment, however, the carrier film comprises a metal such as, for example, copper, aluminum or silver or a combination of said metals. Through the application of the semiconductor substrate 4 and/or 5 on a chuck 9 or a carrier system which is applied more extensively to the substrate and is removed again after the process step, the front side of the substrate facing the chuck, semiconductor substrates can be optimally processed without having to carry out critical yield-reducing intermediate steps. Such a step is for example the thinning down of the semiconductor substrate to a few μm. During this process, according to one embodiment of the invention, the substrate is situated on a, for example, electrostatic chuck of a cluster tool. For highly doped n-type substrates in which the resistivity is less than 1.5 mohms (red phosphorus substrate), the next step is already metallization with, for example, a copper carrier film, according to the invention the substrate adhering to said cluster tool. As a result, the risk of the substrate being damaged is very low. Afterward, the substrate may be removed from the electrostatic chuck and be processed into the back-end in noncritical steps to give the finished product. Carrying out critical steps on thin wafers is thus completely obviated.

In order to increase the adhesion of the film to the semiconductor substrate, one embodiment according to the invention provides for a further adhesion promoting layer 11 to be applied between the electrically conductive film and the rear side of the substrate. This layer serves to increase the adhesion between the film and the semiconductor substrate. The adhesion promoter layer 11 must also be electrically conductive in order to enable the carrier film to serve as an electrical contact. In one particular embodiment of the invention, the adhesion promoting layer is configured as a solder layer.

The adhesion promoting layer 11, in one case, has a thickness of 5 to 2000 nm. The carrier film in one case is applied after the rear side of the semiconductor substrate has been metallized 10. In one particular embodiment of the invention, the semiconductor substrate is subjected to the step of thinning the semiconductor substrate on the chuck 9. It should be noted that the values for the thickness of the semiconductor substrate and the respective layers are merely guide values and that it is possible to deviate from these values in accordance with the invention even though the optimum results are not obtained thereby.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for processing a wafer less than 200 µm thick having front and rear sides and having at least one semiconductor element contained therein, the method comprising:
    depositing a metal layer, which forms electrodes, on the front side of the wafer;
    arranging the wafer onto an electrostatic chuck, the front side of the wafer facing the chuck so that a surface of the electrodes is adjacent to a surface of the electrostatic chuck;
    thinning down the wafer from the rear side while the wafer is still on the chuck;
    applying an electrically conductive film with an adhesion promoting layer to the rear side of the wafer while the wafer is still on the chuck; and
    structuring the electrodes on the front side of the wafer after releasing the front side of the wafer from the chuck, wherein the conductive film is maintained on the rear side of the wafer.

2. The method of claim 1, wherein the wafer has a plurality of semiconductor elements.

3. The method of claim 1, wherein the semiconductor elements are all identical.

4. The method of claim 1, wherein the semiconductor elements are all different.

5. The method of claim 1, wherein the semiconductor elements are selected from the group consisting of high-power transistors, IGBTs, and diodes.

6. The method of claim 1, wherein the electrically conductive film contains metal.

7. The method of claim 6, wherein the metal-containing film has a metal selected from the group consisting of copper, aluminum, and silver.

8. The method of claim 6, wherein the electrically conductive film has a thickness of 5 to 200 µm.

9. The method of claim 6, wherein the adhesion promoting layer is formed by an electrically conductive adhesion promoter layer between the electrically conductive film and a rear side of the wafer.

10. The method of claim 6, further including arranging a contact layer between the electrically conductive film and a rear side of the wafer.

11. The method of claim 9, wherein the adhesion promoting layer is a solder layer.

12. The method of claim 9, wherein the adhesion promoting layer has a thickness of 5 to 2000 nm.

13. The method of claim 6, further including metallizing the rear side of the wafer before the step of applying the electrically conductive film.

14. A method for processing a wafer less than 200 µm thick from its front and rear sides and having at least one semiconductor element previously formed in the wafer, the method comprising following steps in this sequential order:
    (A) depositing a metal layer, which forms electrodes, on the front side of the wafer;
    (B) arranging the wafer onto an electrostatic chuck, the front side of the wafer facing the chuck so that a surface of the electrodes is adjacent to a surface of the electrostatic chuck;
    (C) thinning down the wafer from the rear side;
    (D) applying an electrically conductive film with an adhesive promoting layer to the rear side of the wafer, wherein
        during the steps (C) and (D) the wafer is kept onto the chuck, and
    (E) structuring the electrodes on the wafer's front side upon releasing the front side from the chuck but maintaining the conducting film on the rear side.

* * * * *